(12) United States Patent
Allen

(10) Patent No.: US 12,500,576 B1
(45) Date of Patent: Dec. 16, 2025

(54) RF AND MICROWAVE PHASE SHIFTERS

(71) Applicant: CAES Systems LLC, Arlington, VA (US)

(72) Inventor: Keegan Allen, Indian Harbour Beach, FL (US)

(73) Assignee: CAES Systems LLC, Arlington, VA (US)

( * ) Notice: Subject to any disclaimer, the term of this patent is extended or adjusted under 35 U.S.C. 154(b) by 71 days.

(21) Appl. No.: 18/630,492

(22) Filed: Apr. 9, 2024

(51) Int. Cl.
  *H03H 11/20* (2006.01)
  *H01P 1/20* (2006.01)
  *H01P 1/18* (2006.01)

(52) U.S. Cl.
  CPC ............ *H03H 11/20* (2013.01); *H01P 1/20* (2013.01); *H01P 1/18* (2013.01)

(58) Field of Classification Search
  None
  See application file for complete search history.

(56) References Cited

U.S. PATENT DOCUMENTS 8,339,215 B2 * 12/2012 Huang ................ H03H 19/004
  327/554

* cited by examiner

*Primary Examiner* — Cassandra F Cox
(74) *Attorney, Agent, or Firm* — Alston & Bird LLP

(57) ABSTRACT

Systems, apparatuses, and methods for RF and microwave phase shifter are provided. For example, a phase shift circuit may include: a first switch configured to switch between providing an input signal from the first switch input to either the first switch first output or the first switch second output based on a first control signal; a second switch is configured to switch between the second switch first input and the second switch second input to provide the second switch output; a reference state circuit electrically connected to the first switch first output and the second switch first input and comprising a first switch filter circuit and a first plurality of switch capacitor circuits; and a shift state circuit electrically connected to the first switch second output and the second switch second input and comprising a second switch filter circuit and a second plurality of switch capacitor circuits.

20 Claims, 9 Drawing Sheets

RF AND MICROWAVE PHASE SHIFTERS

TECHNOLOGICAL FIELD

Example embodiments of the present disclosure relate generally to systems, apparatuses, and methods providing phase shifters, including radiofrequency (RF) and microwave phase shifters.

BACKGROUND

Phase shifter circuits may be used in various applications, such as with phased array antennas and/or for receiving or transmitting an RF and/or microwave signal. For example, an RF phase shifter may be comprised of a plurality of bits. In conventional phase shift circuits each phase shift bit may be implemented using separate and distinct filter components, which results in large phase shift circuits that have losses that may be too large for many applications.

The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to phase shift circuits.

In accordance with some embodiments of the present disclosure, an example phase shift circuit is provided. The phase shift circuit may comprise: a first switch with a first switch input, a first switch first output, and a first switch second output, wherein the first switch is configured to switch between providing an input signal from the first switch input to either the first switch first output or the first switch second output based on a first control signal; a second switch with a second switch first input, a second switch second input, and a second switch output, wherein the second switch is configured to switch between the second switch first input and the second switch second input to provide the second switch output; a reference state circuit electrically connected to the first switch first output and also electrically connected to the second switch first input; a shift state circuit electrically connected to the first switch second output and also electrically connected to the second switch second input; wherein the reference state circuit comprises a first switch filter circuit and a first plurality of switch capacitor circuits; and wherein the shift state circuit comprises a second switch filter circuit and a second plurality of switch capacitor circuits.

In accordance with some embodiments of the present disclosure, an example method is provided. The method may comprise: providing a phase shift circuit comprising: a first switch with a first switch input, a first switch first output, and a first switch second output, wherein the first switch is configured to switch between providing an input signal from the first switch input to either the first switch first output or the first switch second output based on a first control signal; a second switch with a second switch first input, a second switch second input, and a second switch output, wherein the second switch is configured to switch between the second switch first input and the second switch second input to provide the second switch output; a reference state circuit electrically connected to the first switch first output and also electrically connected to the second switch first input; a shift state circuit electrically connected to the first switch second output and also electrically connected to the second switch second input; wherein the reference state circuit comprises a first switch filter circuit and a first plurality of switch capacitor circuits; wherein the shift state circuit comprises a second switch filter circuit and a second plurality of switch capacitor circuits; receiving a first control signal to switch the first switch to provide an input signal from the first switch input to the first switch first output and to switch the second switch to provide the second switch first input to the second switch output; receiving the input signal at the first switch; shifting the phase of the input signal with the phase shift circuit; and transmitting an output signal from the phase shift circuit, wherein the output signal is the input signal with a phase shift.

In some embodiments, the phase shift circuit is a 2-bit phase shift circuit.

In some embodiments, the first plurality of switch capacitor circuits of the reference state circuit comprises a first series-parallel switch capacitor circuit and a series switch capacitor circuit; and the second plurality of switch capacitor circuits of the shift state circuit comprises a second series-parallel switch capacitor circuit and a parallel switch capacitor circuit.

In some embodiments, the phase shift circuit is configured for a second control signal to control a switch in each of the first switch filter circuit, the first plurality of switch capacitor circuits, the second switch filter circuit, and the second plurality of switch capacitor circuits to adjust a capacitance of the phase shift circuit.

In some embodiments, the phase shift circuit is a 3-bit phase shift circuit.

In some embodiments, the first plurality of switch capacitor circuits of the reference state circuit comprises a first series-parallel switch capacitor circuit, a first series switch capacitor circuit, a second series switch capacitor circuit, and a first parallel switch capacitor circuit; the second plurality of switch capacitor circuits of the shift state circuit comprises a second series-parallel switch capacitor circuit, a second parallel switch capacitor circuit, and a third parallel switch capacitor circuit; and the shift state circuit further comprises a series-parallel inductor circuit In some embodiments, the phase shift circuit is configured for a second control signal to control a switch in each of the first switch filter circuit, the second series switch capacitor circuit, the first parallel switch capacitor circuit, the second switch filter circuit, the second parallel switch capacitor circuit, and the third parallel switch capacitor circuit to adjust a capacitance of the phase shift circuit; and the phase shift circuit is further configured for a third control signal to control a switch in each of the first series switch capacitor circuit, the first series-parallel switch capacitor circuit, the second series-parallel switch capacitor circuit, and the series-parallel inductor circuit to adjust the capacitance and inductance of the phase shift circuit In some embodiments, the first switch is a first single pole double throw switch, and the second switch is a second single pole double throw switch.

In some embodiments, the first single pole double throw switch comprises four transistors electrically connected in series; and the second single pole double throw switch comprises four transistors electrically connected in series.

In some embodiments, the phase shift circuit is further configured to shift the phase on an input signal by 11.25 degrees, 22.5 degrees, or 33.75 degrees based on the first control signal and a second control signal.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
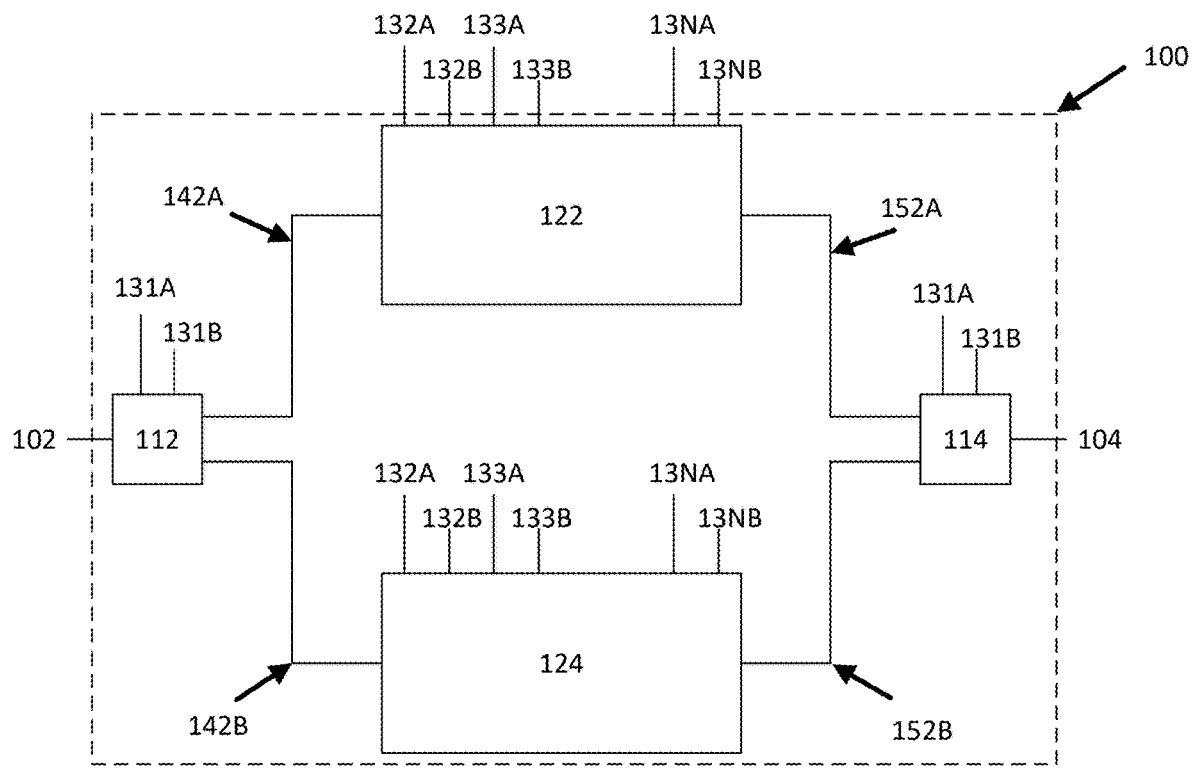
Figure 2:
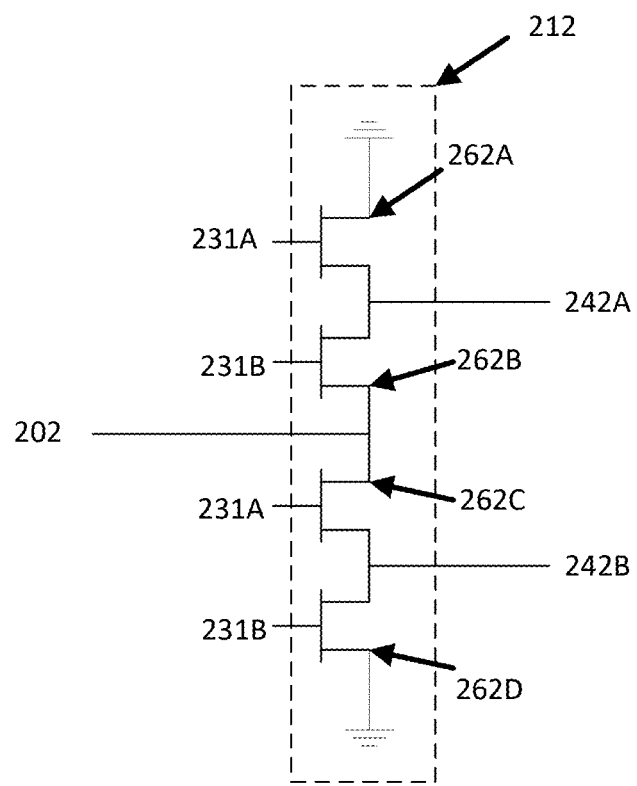
Figure 3A:
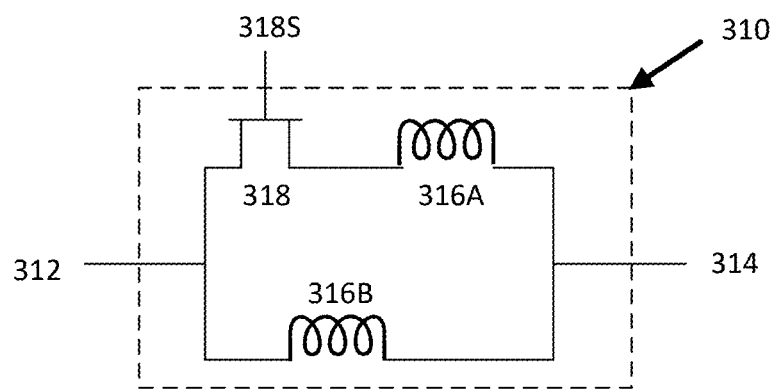
Figure 3B:
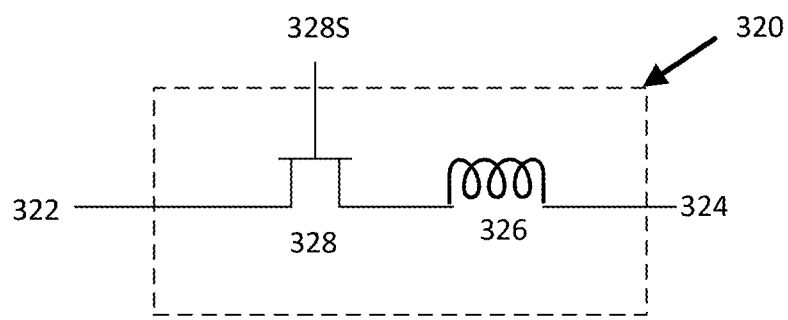
Figure 3C:
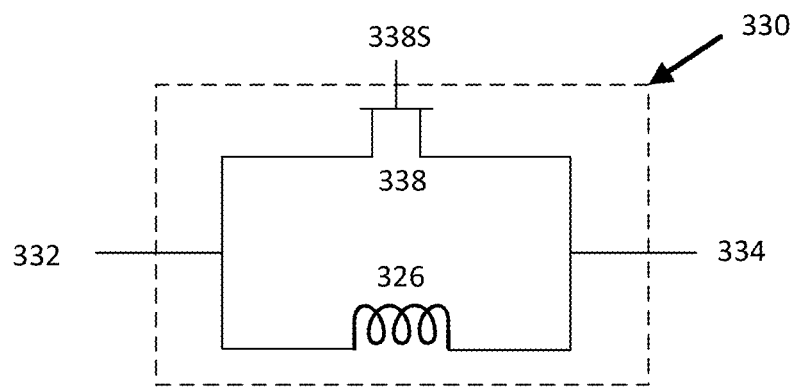
Figure 4A:
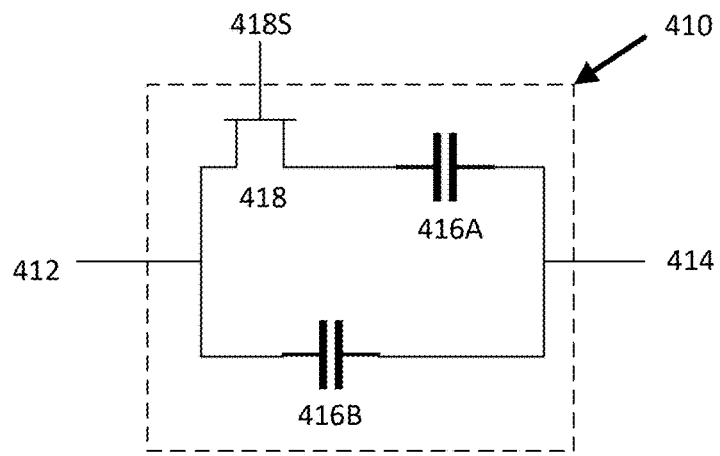
Figure 4B:
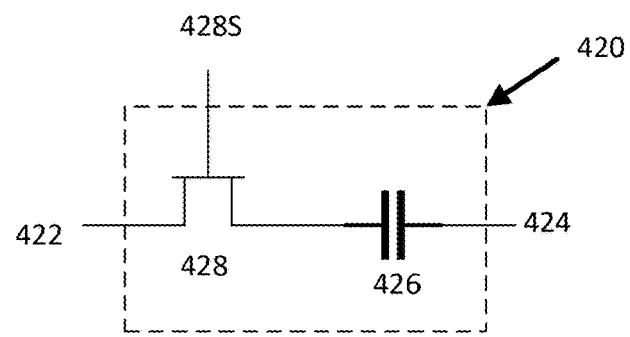
Figure 4C:
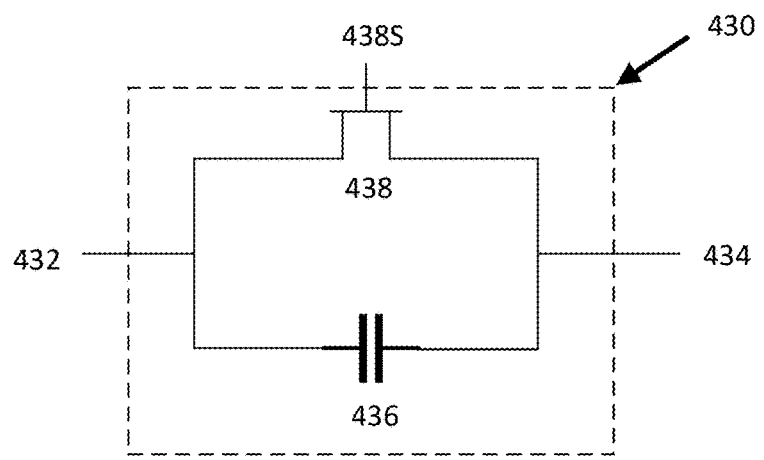
Figure 5:
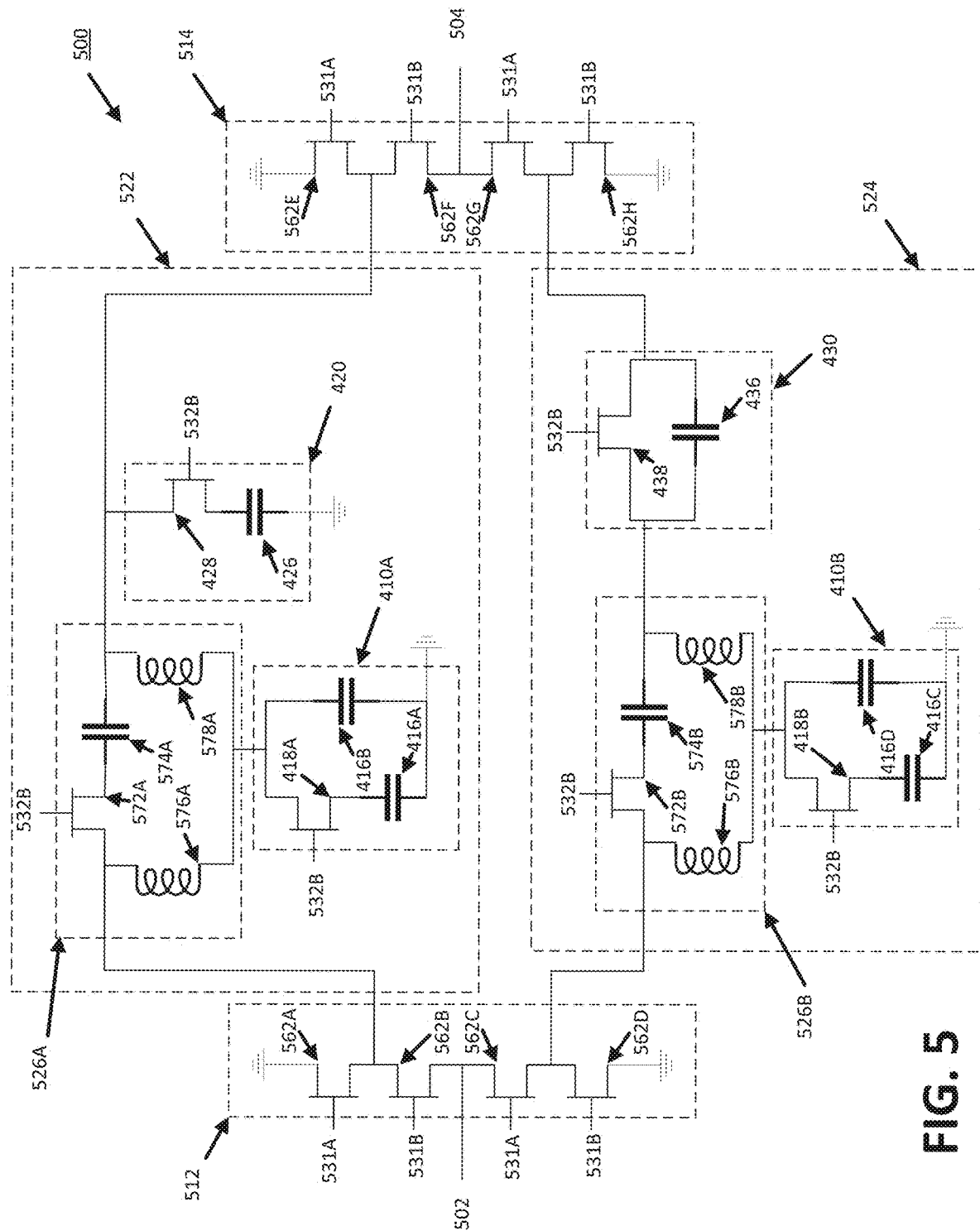
Figure 6:
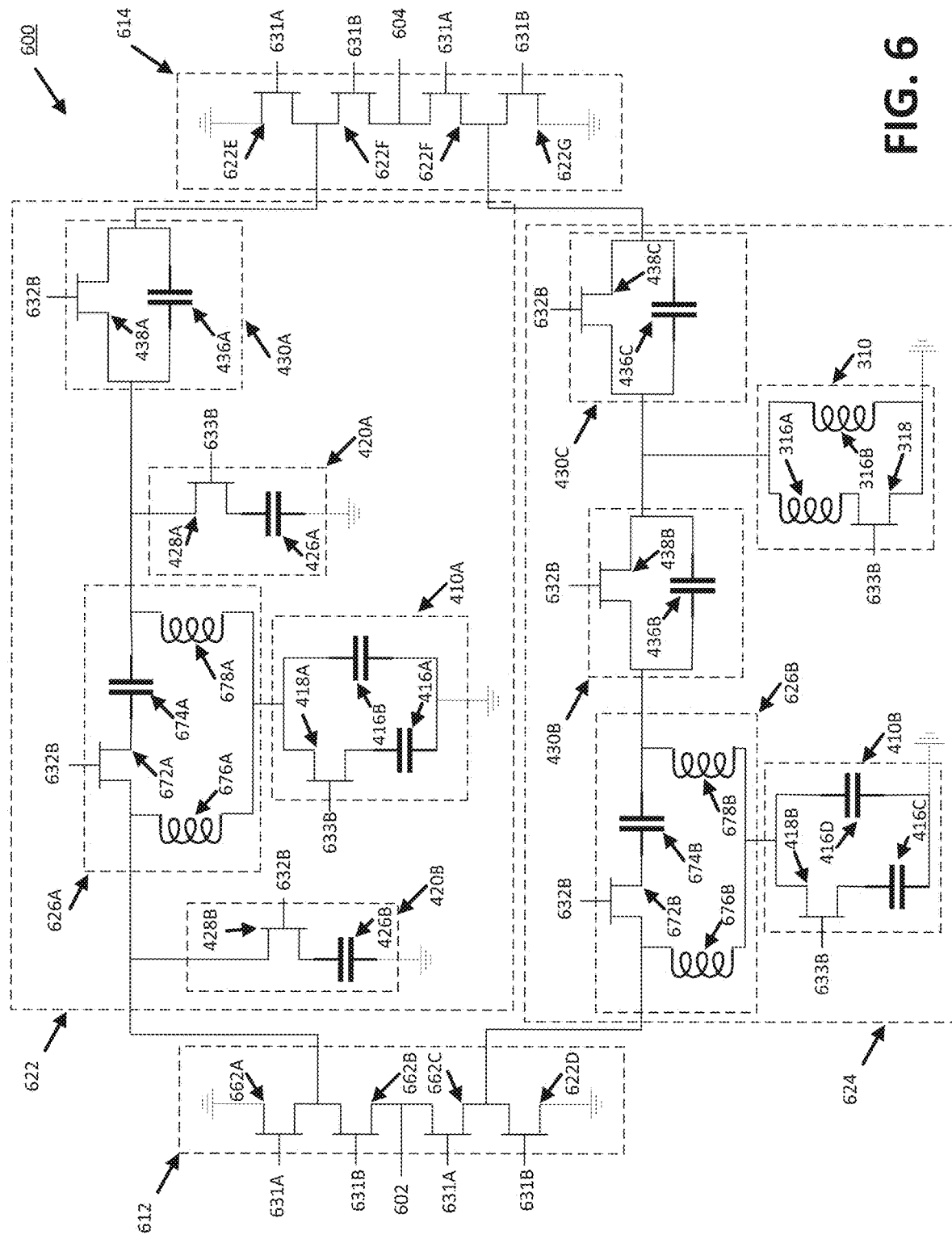
Figure 7:
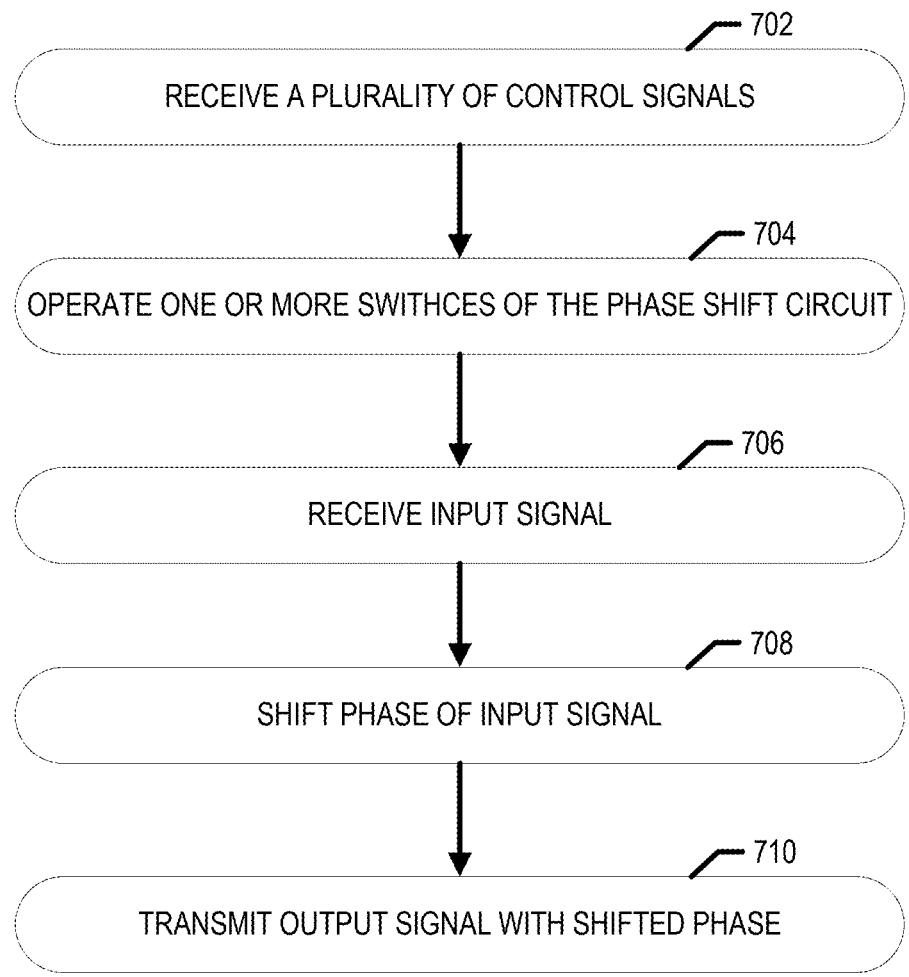
Figure 8:
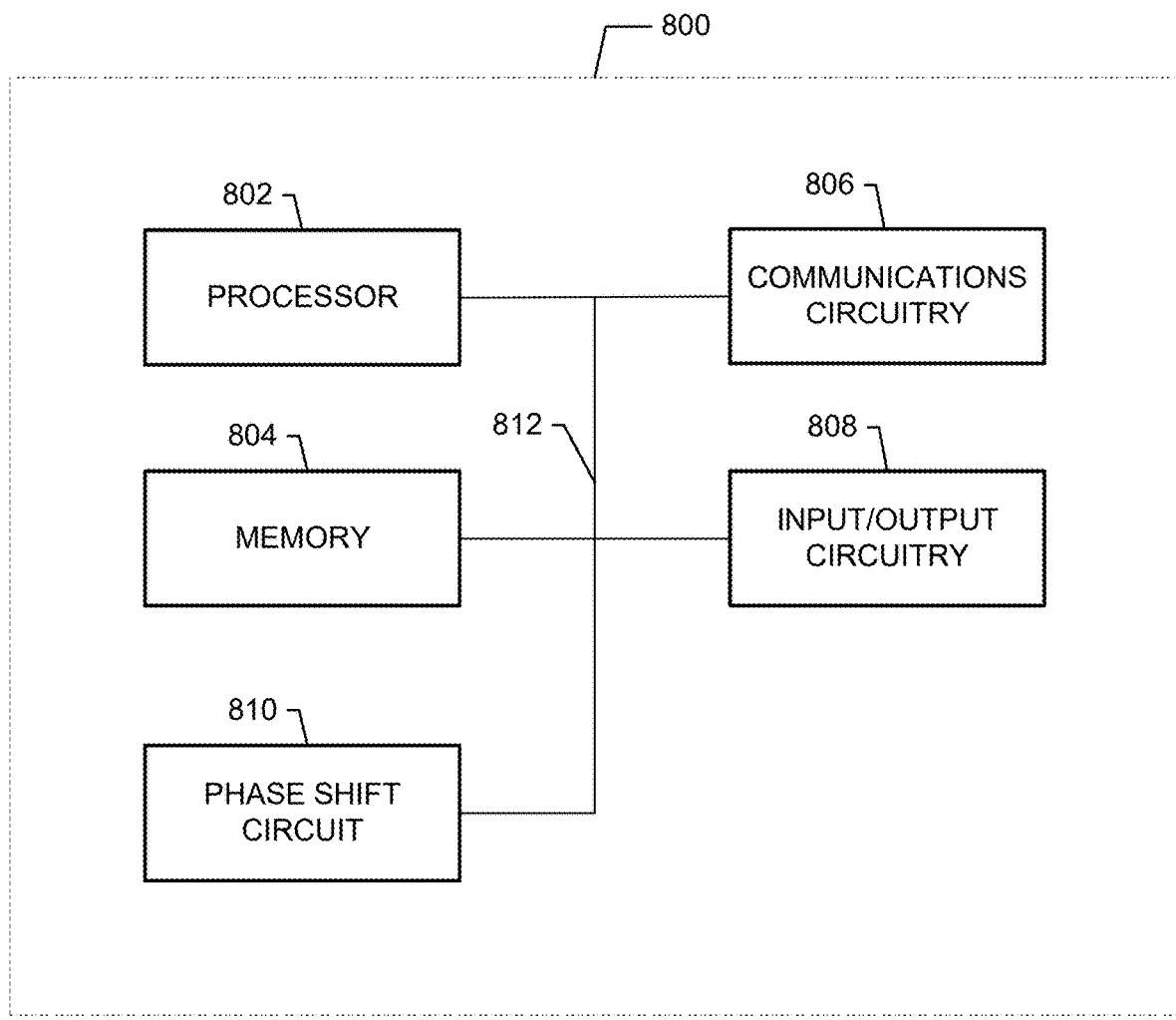
Figure 9:
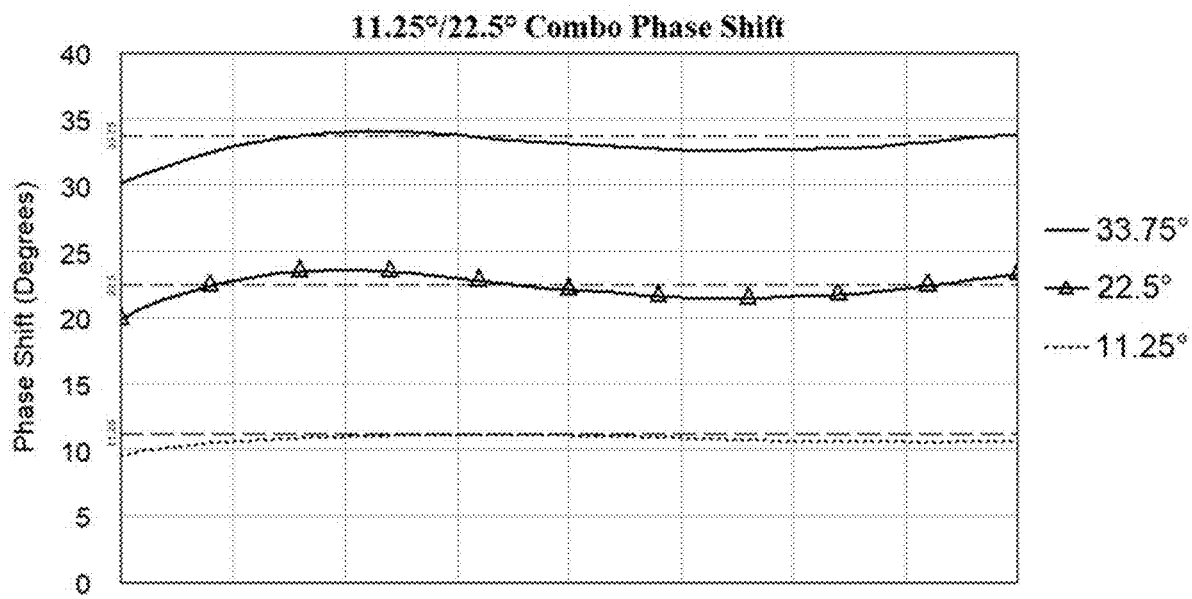
Figure 10:
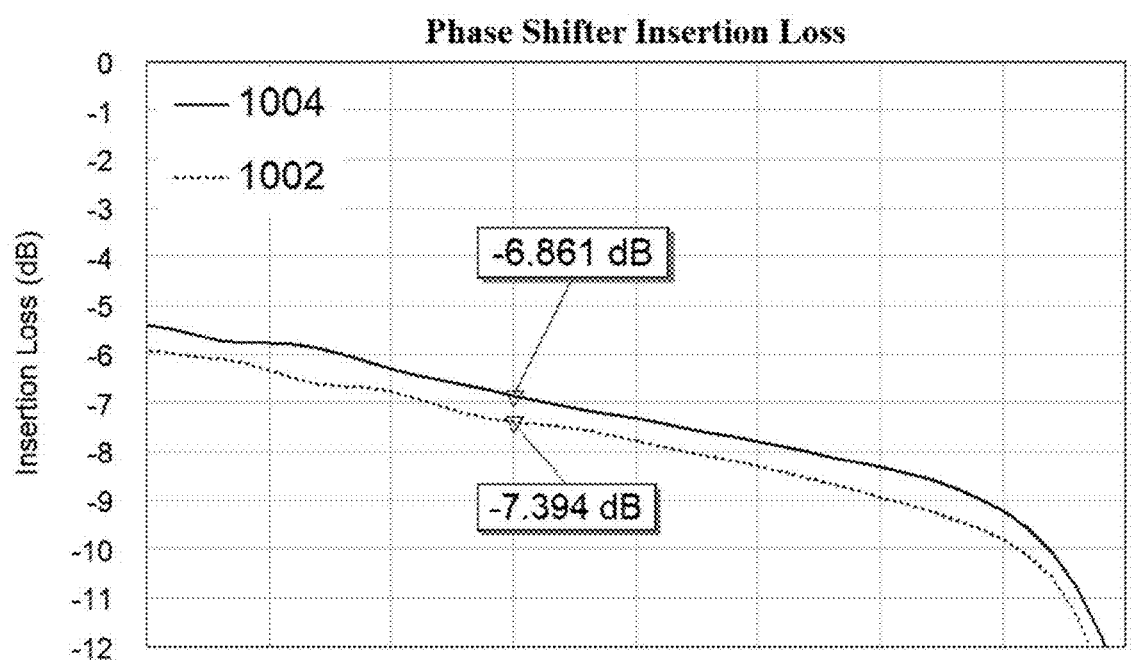

Having thus described certain example embodiments of the present disclosure in general terms, reference will now be made to the accompanying drawings, which are not necessarily drawn to scale, and wherein:

FIG. 1 illustrates an exemplary block diagram of a phase shifter circuit in accordance with one or more embodiments of the present disclosure;

FIG. 2 illustrates an exemplary circuit diagram of a single pole double throw switch circuit in accordance with one or more embodiments of the present disclosure;

FIGS. 3A-3C illustrate exemplary circuit diagrams of switched inductor circuits in accordance with one or more embodiments of the present disclosure;

FIGS. 4A-4C illustrate exemplary circuit diagrams of switched capacitor circuits in accordance with one or more embodiments of the present disclosure;

FIG. 5 illustrates an exemplary circuit diagram of a 2-bit phase shifter circuit in accordance with one or more embodiments of the present disclosure;

FIG. 6 illustrates an exemplary circuit diagram of 3-bit phase shifter circuit in accordance with one or more embodiments of the present disclosure;

FIG. 7 illustrates a flowchart that includes example operations for operating a phase shifter circuit in accordance with one or more embodiments of the present disclosure;

FIG. 8 illustrates an exemplary block diagram of a device in accordance with one or more embodiments of the present disclosure;

FIG. 9 illustrates an exemplary graph of phase shift of an exemplary 2-bit phase shifter circuit in accordance with one or more embodiments of the present disclosure; and FIG. 10 illustrates an exemplary graph of insertion loss of an exemplary 2-bit phase shifter circuit in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to phase shift circuits, which may be referred to as phase shifters. The phase shift circuits may be used in, for example, RF and microwave applications. Such application may include the phase shifter circuits in a monolithic microwave integrated circuit (MMIC).

The phase shift circuit may provide for an n-bit (e.g., 2-bit, 3-bit, etc.) of phase shifting. A digital signal may include a plurality of N bits. These N bits may include a most significant bit to a least significant bit. The phase shifting of bits may be to shift the least significant bit to the most significant bit. By increasing the number of bits (e.g., n-bits) of the phase shift circuit, the phase shift circuit of the present disclosure may phase shift more of the N bits of an RF signal. For example, the step of a phase shift may be associated with the N bits of the input signal. For an input signal with N bits the minimum step size of phase shift may be according to the formula 360 divided by $2^{\wedge}N$. For an N=5 bits input signal, the step size may be 11.25 degrees. A 2-bit phase shift circuit may allow for a phase shift of 11.25 degrees, 22.5 degrees or a combination of 11.25 degrees and 22.5 degrees (i.e., 33.75 degrees). A 3-bit phase shift circuit may allow for a phase shift of 11.25 degrees, 22.5 degrees, 45 degrees or a combination of 11.25 degrees, 22.5 degrees, and 45 degrees (i.e., 33.75 degrees, 56.25 degrees, 67.5 degrees, or 78.75 degrees).

Various embodiments of the present disclosure provides multiple improvements over conventional phase shifters, including utilizing only the amount of filter components needed for a 1 bit of phase shift in conventional phase shifters. The reduction of filter components may allow for reduced losses as the extra components of conventional systems, which may also allow for a reduced size. The reduced size may allow for a smaller or more compact MMIC device or device package.

In various embodiments of the present disclosure, an n-bit phase shift circuit may include two paths that are selected via a first switch and a second switch. In various embodiments, these switches may be single pole double throw switches to control how the input signal is routed in the phase shift circuit between two paths.

Additionally or alternatively, a plurality of switches within each of the two paths are operated to adjust capacitor and/or inductor values of the individual filters to control the phase shift circuitry. In various embodiments these plurality of switches may be transistors, such as gallium arsenide transistors. Thus each path may be controlled for the inductance and/or capacitance of one or more circuits in each path. These plurality of switches may be utilized to adjust the filtering and implement the phase shift.

In various embodiments, the phase shift circuit may be a 2-bit phase shifter. For example, the 2-bit phase shift circuit may be configured as 11.25 bit and 22.5 bit phase shifter, which may allow for a phase shift of 11.25 degrees, 22.5 degrees, or 33.75 degrees. In various embodiments, choosing between the 11.25 bit and 22.5 bit phase shift may be performed with one or more operations of choosing one or two paths of the n-bit phase circuitry. The two paths may be referred to as, for the first path, a reference state circuitry or, for the second path, a shift state circuitry. Additionally, by operating a plurality of transistors as switches in the n-bit phase shift circuit the impedance of the n-bit phase circuitry may be controlled, such as by operating one or more transistor switches to adjust capacitances and/or inductances.

In various embodiments, an n-bit phase shifter may shift bits that are not adjacent. For example, and for a 5 bit input signal, a 2-bit phase shifter may be configured as an 11.25 bit and 22.5 bit phase shifter, which would be shifting adjacent bits. Alternatively or additionally, for a 5 bit input signal, the phase shifter may be configured to shift a different combination of any of the 5 bits. Each of the bits is associated with a different number of degrees of phase shifting. For a 5 bit phase signal, each of the bits may be associated with 11.25 degrees, 22.5 degrees, 45 degrees, 90 degrees, and 180 degrees. In an exemplary embodiment, a 2-bit phase shifter may shift the first bit associated with a 180 degree phase shift and the fifth bit associated with an 11.25 degree phase shift, which would allow for a combined phase shift of 191.25 degrees. Such a 2-bt phase shifter would shift bits of the input signal that are not adjacent. In various embodiments of n-bit input signals, the phase shifter may shift m bits, which may or may not be adjacent.

Exemplary Systems, Apparatuses, and Methods

Embodiments of the present disclosure herein include systems and apparatuses providing phase shift circuit and methods for operating phase shift circuit, which may be implemented in various embodiments.

FIG. 1 illustrates an exemplary block diagram of a phase shifter circuit in accordance with one or more embodiments of the present disclosure. The phase shifter circuit 100 may receive an input signal 102 and provide an output signal 104. When compared to the input signal 102, the output signal 104 may have a phase shift.

In various embodiments, the phase signal circuit may include a first switch 112 and a second switch 114. In various embodiments the first switch 112 may be referred to as an input switch and the second switch 114 may be referred to as an output switch.

The first switch 112 and the second switch 114 may be controlled or operated together to control how the input signal 102 is transmitted through the phase shift circuit 100, such as through a first path illustrated as a top path or a second path illustrated as a bottom path. The first path may be a reference state circuit or reference state circuitry. The second path may be a shift state circuit or a shift state circuitry.

The first switch 112 and the second switch 114 may be single pole double throw switches. The first switch 112 may receive the input signal 102 and switch between a first output electrically connected to the reference state circuit 122 and a second output electrically connected to the shift state circuit 124. When the first switch 112 is operated to provide the input signal 102 to the reference state circuitry 122, the first switch 112 may be providing a reference state input signal 142A. When the first switch 112 is operated to provide the input signal 102 to the shift state circuit 124, the first switch 112 may be providing a shift state input signal 142B. The first switch 112 and the second switch 114 may be controlled or operated by one or more control signals 130 (e.g., 131A, 131B).

The reference state circuit 122 may receive the reference state input signal 142A. The reference state circuit 122 may be controlled or operated by one or more control signals 130 (e.g., 132A, 132B, 133A, . . . 13NB). The output of the reference state circuit 122 may be a reference state output signal 152A, which may be provided to the second switch 114.

The shift state circuit 124 may receive the shift state input signal 142B. The shift state circuit 124 may be controlled or operated by one or more control signals 130 (e.g., 132A, 132B, 133A, . . . 13NB). The output of the shift state circuit 124 may be a shift state output signal 152B, which may be provided to the second switch 114.

The input signal 102 received by the first switch 112 may be, for example, a RF or microwave signal. In various embodiments the input signal may be an analog signal and/or a digital signal. The input signal 102 may comprise a number of bits. The phase shift circuit 100 shifts the phase of the input signal 102 as the signal passes through the phase shifter circuit 100. This phase shift is by a shift of a specific phase angle (e.g., a specific number of degrees), which is based on, among other things, the capacitance and/or inductance of phase shift circuit 100. The capacitance and/or inductance of phase shift circuit 100 may be controlled by one or more control signals (e.g., 132A, 132B).

A phase shift circuit may allow for rotation of up to 360 degrees and, then, depending on the least significant bit determine the resolution. For example, in various embodiments of the phase shift circuit 100, the least significant bit may be 11.25 degrees, which may relate to 5 bits. The 360 degrees with 5 bits associated with 32 steps of 11.25 degrees at a time as the RF signal passes through the phase shifter circuit 100. In an example of such embodiments, a 5 bit phase shift, for allowing 32 steps (i.e., 2^5). The five bits may be associated with 11.25 degrees, 22.5 degrees, 45 degrees, 90 degrees and 180 degrees.

A greater number of bits may allow for a greater resolution. For example, as the number N bits increases the resolution may be improved according to the formula of 360 divided by 2 to the power of N.

The second switch 114 may be operated to select between the reference state output signal 152A and the shift state output signal 152B to select an output signal 104.

In various embodiments, the control signal(s) 130 provided may include a plurality of control signals. For example, there may be one or more control signals 130 for or associated with the first switch 112 and/or the second switch 114. As a further example, there may be one or more control signals 130 associated with the reference state circuit 122 and/or the control state circuit 124.

A control signal 130 may be used for the control signal (e.g., a 1) as well as the inverse or NOT of the control signal (e.g., 0). In various embodiments illustrated this is represented with an A and a B. For example, control signal 131 may have the control signal 131A (e.g., 1) and the inverse control signal 131B (e.g., 0). When the control signal 131A changes state from a 0 to 1, such as with an enable operation or command, then the inverse control signal 131B changes state from a 1 to a 0. Similarly, control signals 132, 133, to 13N may be, respectively, a second control signal, a third control signal, and an Nth control signal.

In various embodiments, there may be a control signal associated with each bit of an N-bit phase shifter circuit. For example, a 2-bit phase shift circuit may have a first control signal 131 (e.g., 131A, 131B) and a second control signal 132 (e.g., 132A, 132B). As a further example, a 3-bit phase shift circuit may have a first control signal 131 (e.g., 131A, 131B), a second control signal 132 (e.g., 132A, 132B), and a third control signal 133 (e.g., 133A, 133B).

In various embodiments, the control signals may be generated in a device with the phase shifter circuit 100 or received from another device, system, or apparatus for controlling or operating the phase shifter circuit 100.

FIG. 2 illustrates an exemplary circuit diagram of a single pole double throw switch circuit in accordance with one or more embodiments of the present disclosure. In various embodiments, the switches 112 and 114 may be implemented with a single pole double throw switch circuit 212.

The single pole double throw switch circuit 212 may receive an input signal 202 and utilize a plurality of switches 262 (e.g., 262A, 262B, 262C, 262D) to provide the input signal 202 as first switch output signal 242A or a second switch output signal 242B.

The plurality of switches 262 may be, for example, a transistor that may be controlled with a control signal. A first switch 262A may be controlled with a first control signal 231A. A second switch 262B may be controlled with a first inverse control signal 231B. A third switch 262C may be controlled with a first control signal 231A. A fourth switch 262D may be controlled with a first inverse control signal 231B.

In various embodiments a single pole double throw switch circuit 212 may be operated with a first control signal 231 that may be provided as the first control signal 231A and the inverse first control signal 231B. In various embodiments, the inverse first control signal 231B may be provided as an inverse of the first control signal 231A. Alternatively or additionally, the inverse first control signal 231B may be generated by single pole double throw switch circuit 212 that may receive a first control signal 231A and utilizing an inverter circuit or NOT circuit.

The first switch 262A, second switch 262B, third switch 262C, and fourth switch 262D may be electrically connected in series with, as illustrated, a ground at each end of the series connection, the input signal 202 received between the second switch 262B and the third switch 262C, the first switch output signal 242A provided between the first switch 262A and the second switch 262B, and the second switch output signal 242B provided between the third switch 262C and the fourth switch 262D. By receiving a first control signal 131A and the inverse first control signal 131B, the first switch 262A, second switch 262B, third switch 262C, and fourth switch 262D are controlled to pass an input signal 202 to provide the input signal 202 as first switch output signal 242A or a second switch output signal 242B.

FIGS. 3A-3C illustrate exemplary circuit diagrams of switched inductor circuits in accordance with one or more embodiments of the present disclosure. FIG. 3A illustrates a series-parallel switched inductor circuit 310. FIG. 3B illustrates a series switched inductor circuit 320. FIG. 3C illustrates a parallel switched inductor circuit 330. In various embodiments, such switched inductor circuits may be configured differently.

FIG. 3A illustrates various embodiments of a series-parallel switched inductor circuit 310. The first switch inductor circuit 310 receives an input 312 and provides an output 314. The series-parallel switched inductor circuit 310 includes a first inductor 316A in series with a switch 318 that are in parallel with a second inductor 316B. The switch 318 may be controlled or operated by a control signal 318S. Controlling the switch 318 may change the inductance of the series-parallel switched inductor circuit 310.

FIG. 3B illustrates various embodiments of a series switched inductor circuit 320. The second switch inductor circuit 320 receives an input 322 and provides an output 324. The series switched inductor circuit 320 includes a second inductor 326 in series with a switch 328. The switch 328 may be controlled or operated by a control signal 328S. Controlling the switch 328 may change the inductance of the series switched inductor circuit 320, which may be by preventing a signal from being transmitted through the series switched inductor circuit 320.

FIG. 3C illustrates various embodiments of a parallel switched inductor circuit 330. The third switch inductor circuit 330 receives an input 332 and provides an output 334. The parallel switched inductor circuit 330 includes a third inductor 336 in parallel with a switch 338. The switch 338 may be controlled or operated by a control signal 338S. Controlling the switch 338 may change the inductance of the parallel switched inductor circuit 330.

FIGS. 4A-4C illustrate exemplary circuit diagrams of switched capacitor circuits in accordance with one or more embodiments of the present disclosure. FIG. 4A illustrates a series-parallel switched capacitor circuit 410. FIG. 4B illustrates a series switched capacitor circuit 420. FIG. 3C illustrates a parallel switched capacitor circuit 430. In various embodiments, such switched capacitor circuits may be configured differently.

FIG. 4A illustrates various embodiments of a series-parallel switched capacitor circuit 310. The first switch capacitor circuit 410 receives an input 412 and provides an output 414. The series-parallel switched capacitor circuit 410 includes a first capacitor 416A in series with a switch 418 that are in parallel with a second capacitor 416B. The switch 18 may be controlled or operated by a control signal 418S. Controlling the switch 418 may change the inductance of the series-parallel switched capacitor circuit 410.

FIG. 4B illustrates various embodiments of a series switched capacitor circuit 420. The second switch capacitor circuit 420 receives an input 422 and provides an output 424.

The series switched capacitor circuit 420 includes a second capacitor 426 in series with a switch 428. The switch 428 may be controlled or operated by a control signal 428S. Controlling the switch 428 may change the inductance of the series switched capacitor circuit 420, which may be by preventing a signal from being transmitted through the series switched capacitor circuit 420.

FIG. 4C illustrates various embodiments of a parallel switched capacitor circuit 430. The parallel switch capacitor circuit 430 receives an input 432 and provides an output 434. The parallel switched capacitor circuit 430 includes a third capacitor 436 in parallel with a switch 438. The switch 438 may be controlled or operated by a control signal 438S. Controlling the switch 438 may change the inductance of the parallel switched capacitor circuit 430.

FIG. 5 illustrates an exemplary circuit diagram of a 2-bit phase shifter circuit in accordance with one or more embodiments of the present disclosure. The phase shifter circuit 500 is exemplary of one or more embodiments of the present disclosure for a 2-bit phase shifter circuit.

The phase shifter circuit 500 receives an input signal 502 and provides an output signal 504. The input signal 502 is received at a first switch 512. The first switch 512 is controlled or operated by a first control signal 531 (e.g., 531A, 531B) to switch between providing the input signal 502 to either a reference state circuit 522 or a shift state circuit 524. The output of reference state circuit 522 or shift state circuit 524 are provided to a second switch 514. The second switch 514 is controlled or operated by the first control signal 531 (e.g., 531A, 531B) to switch between receiving the output of reference state circuit 522 or the output of shift state circuit 524, which is then provided as output signal 504.

The first switch 512 may be a single pole double throw switch circuit. The first switch 512 may receive the input signal 502 and utilize a plurality of switches 562 (e.g., 562A, 562B, 562C, 562D) to provide the input signal 502 to either the reference state circuit 522 or the shift state circuit 524. The plurality of switches 562 (e.g., 562A, 562B, 562C, 562D) may be configured as described herein, such as with FIG. 2, and may be controlled by a first control signal 531 and an inverse first control signal 531B, such as described herein.

The second switch 514 may be a single pole double throw switch circuit. The second switch 514 may be controlled or operated to receive a signal from either reference state circuit 522 or shift state circuit 524 and utilize a plurality of switches 562 (e.g., 562E, 562F, 562G, 562H) to select from these two inputs to provide an output signal 504. The plurality of switches 562 (e.g., 562E, 562F, 562G, 562H) may be configured as described herein, such as with FIG. 2, and may be controlled by a first control signal 531 and an inverse first control signal 531B, such as described herein.

The reference state circuit 522 may include a first switch filter circuit 526A, a first switch capacitor circuit, and a second switch capacitor circuit. In various embodiments, the first switch capacitor circuit may be a first series-parallel switch capacitor circuit 410A and the second switched capacitor circuit may be a series switch capacitor circuit 420.

The first switch filter circuit 526A may include a pair of coupled inductors with an inductor 576A and an inductor 578A. The pair of coupled inductors each have a first terminal and a second terminal. The first terminals of the pair of coupled inductors are electrically connected with a switch 572A and a capacitor 574A. The second terminals of the pair of coupled inductors are electrically connected.

The first switch capacitor circuit of a series-parallel capacitor circuit 410A may include a capacitor 416A, a capacitor 416B, and a switch 418A configured as described herein for a series-parallel capacitor circuit 410.

The second switch capacitor circuit of a series capacitor circuit 420 may include a capacitor 426 and a switch 428 configured as described herein for a series capacitor circuit 420.

In various embodiments, the switch 572A, switch 418A, and switch 428 of the reference state circuit 522 may be controlled or operated with the same control signal. This same control signal may be a second control signal 532, including with an inverse second control signal 532B. For example, when a second control signal 532 or 532A is enabled, the inverse second control signal 532B may control or operate the switch 572A, switch 418A, and switch 428 to open or close, which would adjust the capacitance of the reference state circuit 522. Adjusting the capacitance of the reference state circuit 522 may adjust the phase shift of the phase shift circuit 500.

The shift state circuit 524 may include second switch filter circuit 526B, third switch capacitor circuit, and a fourth switch capacitor circuit. In various embodiments, the third switch capacitor circuit may be a second series-parallel switch capacitor circuit 410B and the fourth switch capacitor circuit may be a parallel switch capacitor circuit 430.

The second switch filter circuit 526B may include a pair of coupled inductors with an inductor 576B and an inductor 578B. The pair of coupled inductors each have a first terminal and a second terminal. The first terminals of the pair of coupled inductors are electrically connected with a switch 572B and a capacitor 574B. The second terminals of the pair of coupled inductors are electrically connected.

The third switch capacitor circuit of a series-parallel capacitor circuit 410B may include a capacitor 416C, a capacitor 416D, and a switch 418B configured as described herein for a series-parallel capacitor circuit 410.

The fourth switch capacitor circuit of a parallel capacitor circuit 430 may include a capacitor 436 and a switch 438 configured as described herein for a parallel capacitor circuit 430.

In various embodiments, the switch 572B, switch 418B, and switch 438 of the shift state circuit 500 may be controlled or operated with the same control signal. This same control signal may be a second control signal 532, including with an inverse second control signal 532B. For example, when a second control signal 532 or 532A is enabled, the inverse second control signal 532B may control or operate the switch 572B, switch 418B, and switch 438 to open or close, which would adjust the capacitance of the shift state circuit 524. Adjusting the capacitance of the shift state circuit 524 may adjust the phase shift of the phase shift circuit 500.

In various embodiments, the phase difference between the first switch filter circuit 526A and the second switch filter circuit 526B may be a phase shift to be achieved.

In various embodiments, one or more additional electrical components may be added to the phase shift circuit 500. For example, one or more resistors may be added. Such resistors may be added to each input of a control signal to control the termination of the control signal and/or control the amplitude of the control signal being provided to operate an associated switch.

It will be appreciated that various embodiments or the present disclosure include adding, subtracting, or modifying one or more of the switch capacitor circuit(s) and/or switch inductor circuit(s), such as to and/or from the reference state circuit 522 and/or the shift state circuit 524.

FIG. 6 illustrates an exemplary circuit diagram of 3-bit phase shifter circuit in accordance with one or more embodiments of the present disclosure. The phase shifter circuit 600 is exemplary of one or more embodiments of the present disclosure for a 3-bit phase shifter circuit.

The phase shifter circuit 600 receives an input signal 602 and provides an output signal 604. The input signal 602 is received at a first switch 612. The first switch 612 is controlled or operated by a first control signal 631 (e.g., 631A, 631B) to switch between providing the input signal 602 to either a reference state circuit 622 or shift state circuit 624. The output of reference state circuit 622 or shift state circuit 624 are provided to a second switch 614. The second switch 614 is controlled or operated by the first control signal 631 (e.g., 631A, 631B) to switch between receiving the output of reference state circuit 622 or the output of shift state circuit 624, which is then provided as output signal 604.

The first switch 612 may be a single pole double throw switch circuit. The first switch 612 may receive the input signal 602 and utilize a plurality of switches 662 (e.g., 662A, 662B, 662C, 662D) to provide the input signal 602 to either the reference state circuit 622 or the shift state circuit 624. The plurality of switches 662 (e.g., 662A, 662B, 662C, 662D) may be configured as described herein, such as with FIG. 2, and may be controlled by a first control signal 631 and an inverse first control signal 631B, such as described herein.

The second switch 614 may be a single pole double throw switch circuit. The second switch 614 may be controlled or operated to receive a signal from either reference state circuit 622 or shift state circuit 624 and utilize a plurality of switches 662 (e.g., 662E, 662F, 662G, 662H) to select from these two inputs to provide an output signal 604. The plurality of switches 662 (e.g., 662E, 662F, 662G, 662H) may be configured as described herein, such as with FIG. 2, and may be controlled by a first control signal 631 and an inverse first control signal 631B, such as described herein.

The reference state circuit 622 may include a first switch filter circuit 626A, a first switch capacitor circuit, a second switch capacitor circuit, a third switch capacitor circuit, and a fourth switch capacitor circuit. In various embodiments, the first switch capacitor circuit may be a first series-parallel switch capacitor circuit 410A, the second switched capacitor circuit may be a series switch capacitor circuit 420A, the third switched capacitor circuit may be a series switch capacitor circuit 420B, and the fourth switched capacitor circuit may be a parallel switch capacitor circuit 430A.

The first switch filter circuit 626A may include a pair of coupled inductors with an inductor 676A and an inductor 678A. The pair of coupled inductors each have a first terminal and a second terminal. The first terminals of the pair of coupled inductors are electrically connected with a switch 672A and a capacitor 674A. The second terminals of the pair of coupled inductors are electrically connected.

The first switch capacitor circuit of a series-parallel capacitor circuit 410A may include a capacitor 416A, a capacitor 416B, and a switch 418A configured as described herein for a series-parallel capacitor circuit 410.

The second switch capacitor circuit of a series capacitor circuit 420A may include a capacitor 426A and a switch 428A configured as described herein for a series capacitor circuit 420.

The third switch capacitor circuit of a series capacitor circuit 420B may include a capacitor 426B and a switch 428B configured as described herein for a series capacitor circuit 420.

The fourth switch capacitor circuit of a parallel capacitor circuit 430A may include a capacitor 436A and a switch 438A configured as described herein for a parallel capacitor circuit 430.

In various embodiments, the switch 672A, switch 418A, switch 428A, switch 428B, and switch 438A of the reference state circuit 622 may be controlled or operated with a second control signal 632 (e.g., 632A, 632B) and a third control signal 633 (e.g., 633A, 633B). Each of these control signals may be a control signal 632, 633, including with an inverse control signal 632B, 633B. For example, when a second control signal 632 or 632A is enabled, the inverse second control signal 632B may control or operate the switch 672A, switch 428B, and switch 438A to open or close, which would adjust the capacitance of the reference state circuit 622. Additionally and/or alternatively, a third control signal 633 or 633A may be enabled and the inverse third control signal 633B may control or operate the switch 418A and switch 428A to open or close, which would adjust the capacitance of the reference state circuit 622. Adjusting the capacitance of the reference state circuit 622 may adjust the phase shift of the phase shift circuit 600.

The shift state circuit 624 may include second switch filter circuit 626B, fifth switch capacitor circuit, a sixth switch capacitor circuit, and a switch inductor circuit. In various embodiments, the fifth switch capacitor circuit may be a second series-parallel switch capacitor circuit 410B, the sixth switch capacitor circuit may be a parallel switch capacitor circuit 430A, and the seventh switch capacitor circuit may be a parallel switch capacitor circuit 430B. The switch inductor circuit may be a series-parallel switch inductor circuit 310.

The second switch filter circuit 626B may include a pair of coupled inductors with an inductor 676B and an inductor 678B. The pair of coupled inductors each have a first terminal and a second terminal. The first terminals of the pair of coupled inductors are electrically connected with a switch 672B and a capacitor 674B. The second terminals of the pair of coupled inductors are electrically connected.

The fifth switch capacitor circuit of a series-parallel capacitor circuit 410B may include a capacitor 416C, a capacitor 416D, and a switch 418B configured as described herein for a series-parallel capacitor circuit 410.

The sixth switch capacitor circuit of a parallel capacitor circuit 430B may include a capacitor 436B and a switch 438B configured as described herein for a parallel capacitor circuit 430.

The seventh switch capacitor circuit of a parallel capacitor circuit 430C may include a capacitor 436C and a switch 438C configured as described herein for a parallel capacitor circuit 430.

The switch inductor circuit of a series-parallel inductor circuit 310 may include an inductor 316A in series with a switch 318 that are both in parallel with an inductor 316B configured as described herein for a series-parallel inductor circuit 310.

In various embodiments, the switch 572B, switch 418B, switch 438B, switch 438C, and switch 318 of the shift state circuit 600 may be controlled or operated with a second control signal 632 (e.g., 632A, 632B) and a third control signal 633 (e.g., 633A, 633B). Each of these control signals may be a control signal 632, 633, including with an inverse control signal 632B, 633B. For example, when a second control signal 632 or 632A is enabled, the inverse second control signal 632B may control or operate the switch 672B, switch 438B, and switch 438C to open or close, which would adjust the capacitance of the shift state circuit 624. Additionally and/or alternatively, a third control signal 633 or 633A may be enabled and the inverse third control signal 633B may control or operate the switch 418B and switch 318 to open or close, which would adjust the capacitance of the shift state circuit 622. Adjusting the capacitance of the shift state circuit 624 may adjust the phase shift of the phase shift circuit 600.

In various embodiments, the phase difference between the first switch filter circuit 626A and the second switch filter circuit 626B may be a phase shift to be achieved.

In various embodiments, one or more additional electrical components may be added to the phase shift circuit 600. For example, one or more resistors may be added. Such resistors may be added to each input of a control signal to control the termination of the control signal and/or control the amplitude of the control signal being provided to operate an associated switch.

It will be appreciated that various embodiments or the present disclosure include adding, subtracting, or modifying one or more of the switch capacitor circuit(s) and/or switch inductor circuit(s), such as to and/or from the reference state circuit 622 and/or the shift state circuit 624.

FIG. 7 illustrates a flowchart that includes example operations for operating a phase shifter circuit in accordance with one or more embodiments of the present disclosure.

At operation 702, a plurality of control signals are received. In various embodiments, the number of the plurality of control signals received are associated with the number of n-bits the phase shift circuit 100 is configured to shift. A 2-bit phase shift circuit 500 may include 2 control signals 531, 532. A 3-bit phase shift circuit 600 may include 3 control signals 631, 632. 633.

At operation 704, one or more switches of a phase shift circuit are operated. The phase shift circuit 100 may include a plurality of switches, and the plurality of control signals may be used to operate or control those switches, such as described herein. Operating or controlling these switches may adjust a capacitance and/or impedance of the phase shift circuit 100, which may adjust the amount of the phase of an input signal that may be shifted when providing an output signal.

At operation 706, an input signal is received. An input signal 101 may be received and operated on by the phase shift circuit 100.

At operation 708, a phase of the input signal is shifted. The phase shift circuit 100, having received the input signal 102, may operate to shift the phase of the input signal 102. The amount of the phase shift may be based on the capacitance and/or inductor of the phase shift circuit 100 as controlled or operated on by the control signals received.

At operation 710, an output signal with shifted phase is transmitted. The input signal 102 having its phase shifted by the phase shift circuit 100 may be output as an output signal 104.

In various embodiments one or more of the above operations may be repeated to allow for control of phase shifts of a single input signal and/or multiple input signals.

FIG. 8 illustrates an exemplary block diagram of a device in accordance with one or more embodiments of the present disclosure. Exemplary embodiments of the device 800 may include, but are not limited to, telecommunication devices, phased array antennas, and the like. The device 800 illustrated includes a processor 802, memory 804, communications circuitry 806, and input/output circuitry 808, and phase shift circuit 810, which may all be connected via a bus 812.

The processor 802, although illustrated as a single block, may be comprised of a plurality of components and/or processor circuitry. The processor 802 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits, such as ASICs, FPGAs, systems-on-a-chip (SoC), or combinations thereof. In various embodiments, the processor 802 may be configured to execute applications, instructions, and/or programs stored in the processor 802, memory 804, or otherwise accessible to the processor 802. When executed by the processor 802, these applications, instructions, and/or programs may enable the execution of one or a plurality of the operations and/or functions described herein. Regardless of whether it is configured by hardware, firmware/software methods, or a combination thereof, the processor 802 may comprise entities capable of executing operations and/or functions according to the embodiments of the present disclosure when correspondingly configured.

The memory 804 may comprise, for example, a volatile memory, a non-volatile memory, or a certain combination thereof. Although illustrated as a single block, the memory 804 may comprise a plurality of memory components. In various embodiments, the memory 804 may comprise, for example, a random access memory, a cache memory, a flash memory, a hard disk, a circuit configured to store information, or a combination thereof. The memory 804 may be configured to write or store data, information, application programs, instructions, etc. so that the processor 802 may execute various operations and/or functions according to the embodiments of the present disclosure. For example, in at least some embodiments, a memory 804 may be configured to buffer or cache data for processing by the processor 802. Additionally or alternatively, in at least some embodiments, the memory 804 may be configured to store program instructions for execution by the processor 802. The memory 804 may store information in the form of static and/or dynamic information. When the operations and/or functions are executed, the stored information may be stored and/or used by the processor 802.

The communication circuitry 806 may be implemented as a circuit, hardware, computer program product, or a combination thereof, which is configured to receive and/or transmit data from/to another component or apparatus. The computer program product may comprise computer-readable program instructions stored on a computer-readable medium (e.g., memory 804) and executed by a processor 802. In various embodiments, the communication circuitry 806 (as with other components discussed herein) may be at least partially implemented as part of the processor 802 or otherwise controlled by the processor 802. The communication circuitry 806 may communicate with the processor 802, for example, through a bus 812. Such a bus 812 may connect to the processor 802, and it may also connect to one or more other components of the processor 802. The communication circuitry 806 may be comprised of, for example, transmitters, receivers, transceivers, network interface cards and/or supporting hardware and/or firmware/software, and may be used for establishing communication with another component(s), apparatus(es), and/or system(s). The communication circuitry 806 may be configured to receive and/or transmit data that may be stored by, for example, the memory 804 by using one or more protocols that can be used for communication between components, apparatuses, and/or systems.

The input/output circuitry 808 may communicate with the processor 802 to receive instructions input by an operator and/or to provide audible, visual, mechanical, or other outputs to an operator. The input/output circuitry 808 may comprise supporting devices, such as a keyboard, a mouse, a user interface, a display, a touch screen display, lights (e.g., warning lights), indicators, speakers, and/or other input/output mechanisms. The input/output circuitry 808 may comprise one or more interfaces to which supporting devices may be connected.

The phase shift circuit 810 may be configured as described herein. The phase shift circuit 808 may be included in a MMIC. The input signal to the phase shift circuit 810 may be received from another portion of device 800 (e.g., processor 802, communications circuitry 806, input/output circuitry 808). The output signal from the phase shift circuit 810 may be transmitted or provided to another portion of device 800 (e.g., processor 802, memory 804, communications circuitry 806, input/output circuitry 808).

FIG. 9 illustrates an exemplary graph of phase shift of an exemplary 2-bit phase shifter circuit in accordance with one or more embodiments of the present disclosure. FIG. 9 includes a graph of 2-bit phase shift that may shift the phase of an input signal by 11.25 degrees, 22.5 degrees, or 33.75 degrees. As it readily appreciated, 33.75 degrees is a combination (i.e., sum) of 11.25 degrees and 22.5 degrees. In various embodiments, a 2-bit phase shift circuit associated with an 11.25 degree phase shift and 22.5 degree phase shift may be operated to generate an output signal 104 with a phase shift from an input signal 102 of 11.25 degrees, 22.5 degrees, or 33.75 degrees.

FIG. 10 illustrates an exemplary graph of insertion loss of an exemplary 2-bit phase shifter circuit in accordance with one or more embodiments of the present disclosure. FIG. 10 includes a graph of insertion loss over a range of frequencies of an embodiment of present disclosure compared to a conventional phase shifter. This graph illustrates an improvement with a reduction in insertion loss. In particular, a first insertion loss line 1002 associated with a conventional phase shift circuit on the graph has −7.394 dB of insertion loss at the output signal. In contrast, a second insertion loss line 1004 associated with an embodiment of a 2-bit phase shift circuit of the present disclosure has an improved insertion loss of −6.861 dB, which is over 0.5 dB improvement.

It should be readily appreciated that the embodiments of the systems and apparatuses, described herein may be configured in various additional and alternative manners in addition to those expressly described herein.

CONCLUSION

Operations and/or functions of the present disclosure have been described herein, such as in flowcharts. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. A phase shift circuit comprising:
    a first switch with a first switch input, a first switch first output, and a first switch second output, wherein the first switch is configured to switch between providing an input signal from the first switch input to either the first switch first output or the first switch second output based on a first control signal;
    a second switch with a second switch first input, a second switch second input, and a second switch output, wherein the second switch is configured to switch between the second switch first input and the second switch second input to provide the second switch output;
    a reference state circuit electrically connected to the first switch first output and also electrically connected to the second switch first input;
    a shift state circuit electrically connected to the first switch second output and also electrically connected to the second switch second input;
    wherein the reference state circuit comprises a first switch filter circuit and a first plurality of switch capacitor circuits; and
    wherein the shift state circuit comprises a second switch filter circuit and a second plurality of switch capacitor circuits.

2. The phase shift circuit of claim 1, wherein the phase shift circuit is a 2-bit phase shift circuit.

3. The phase shift circuit of claim 1, wherein the first plurality of switch capacitor circuits of the reference state circuit comprises a first series-parallel switch capacitor circuit and a series switch capacitor circuit; and wherein the second plurality of switch capacitor circuits of the shift state circuit comprises a second series-parallel switch capacitor circuit and a parallel switch capacitor circuit.

4. The phase shift circuit of claim 2, wherein the phase shift circuit is further configured to shift a phase of an input signal for a first bit of the input signal and a second bit of the input signal, wherein the first bit of the input signal is not adjacent to the second bit of the input signal.

5. The phase shift circuit of claim 3, wherein the phase shift circuit is configured for a second control signal to control a switch in each of the first switch filter circuit, the first plurality of switch capacitor circuits, the second switch filter circuit, and the second plurality of switch capacitor circuits to adjust a capacitance of the phase shift circuit.

6. The phase shift circuit of claim 1, wherein the phase shift circuit is a 3-bit phase shift circuit.

7. The phase shift circuit of claim 1, wherein the first plurality of switch capacitor circuits of the reference state circuit comprises a first series-parallel switch capacitor circuit, a first series switch capacitor circuit, a second series switch capacitor circuit, and a first parallel switch capacitor circuit;

wherein the second plurality of switch capacitor circuits of the shift state circuit comprises a second series-parallel switch capacitor circuit, a second parallel switch capacitor circuit, and a third parallel switch capacitor circuit; and wherein the shift state circuit further comprises a series-parallel inductor circuit.

8. The phase shift circuit of claim 7, wherein the phase shift circuit is configured for a second control signal to control a switch in each of the first switch filter circuit, the second series switch capacitor circuit, the first parallel switch capacitor circuit, the second switch filter circuit, the second parallel switch capacitor circuit, and the third parallel switch capacitor circuit to adjust a capacitance of the phase shift circuit; and wherein the phase shift circuit is further configured for a third control signal to control a switch in each of the first series switch capacitor circuit, the first series-parallel switch capacitor circuit, the second series-parallel switch capacitor circuit, and the series-parallel inductor circuit to adjust the capacitance and inductance of the phase shift circuit.

9. The phase shift circuit of claim 1, wherein the first switch is a first single pole double throw switch, and wherein the second switch is a second single pole double throw switch.

10. The phase shift circuit of claim 9, wherein the first single pole double throw switch comprises four transistors electrically connected in series; and wherein the second single pole double throw switch comprises four transistors electrically connected in series.

11. A method comprising:
providing a phase shift circuit comprising:
a first switch with a first switch input, a first switch first output, and a first switch second output, wherein the first switch is configured to switch between providing an input signal from the first switch input to either the first switch first output or the first switch second output based on a first control signal;

a second switch with a second switch first input, a second switch second input, and a second switch output, wherein the second switch is configured to switch between the second switch first input and the second switch second input to provide the second switch output;

a reference state circuit electrically connected to the first switch first output and also electrically connected to the second switch first input;

a shift state circuit electrically connected to the first switch second output and also electrically connected to the second switch second input;

wherein the reference state circuit comprises a first switch filter circuit and a first plurality of switch capacitor circuits; and wherein the shift state circuit comprises a second switch filter circuit and a second plurality of switch capacitor circuits; and receiving a first control signal to switch the first switch to provide an input signal from the first switch input to the first switch first output and to switch the second switch to provide the second switch first input to the second switch output;

receiving the input signal at the first switch;

shifting the phase of the input signal with the phase shift circuit; and transmitting an output signal from the phase shift circuit, wherein the output signal is the input signal with a phase shift.

12. The method of claim 11, wherein the phase shift circuit is a 2-bit phase shift circuit.

13. The method of claim 12, wherein the phase shift circuit is further configured to shift the phase on an input signal for a first bit of the input signal and a second bit of the input signal, wherein the first bit of the input signal is not adjacent to the second bit of the input signal.

14. The method of claim 11, wherein the first plurality of switch capacitor circuits of the reference state circuit comprises a first series-parallel switch capacitor circuit and a series switch capacitor circuit; and wherein the second plurality of switch capacitor circuits of the shift state circuit comprises a second series-parallel switch capacitor circuit and a parallel switch capacitor circuit.

15. The method of claim 14, wherein the phase shift circuit is configured for a second control signal to control a switch in each of the first switch filter circuit, the first plurality of switch capacitor circuits, the second switch filter circuit, and the second plurality of switch capacitor circuits to adjust a capacitance of the phase shift circuit.

16. The method of claim 11, wherein the phase shift circuit is a 3-bit phase shift circuit.

17. The method of claim 11, wherein the first plurality of switch capacitor circuits of the reference state circuit comprises a first series-parallel switch capacitor circuit, a first series switch capacitor circuit, a second series switch capacitor circuit, and a first series-parallel switch capacitor circuit;

wherein the second plurality of switch capacitor circuits of the shift state circuit comprises a second series-parallel switch capacitor circuit, a second parallel switch capacitor circuit, and a third parallel switch capacitor circuit; and wherein the shift state circuit further comprises a series-parallel inductor circuit.

18. The method of claim 17, wherein the phase shift circuit is configured for a second control signal to control a switch in each of the first switch filter circuit, the second series switch capacitor circuit, the first parallel switch capacitor circuit, the second switch filter circuit, the second parallel switch capacitor circuit, and the third parallel switch capacitor circuit to adjust a capacitance of the phase shift circuit; and wherein the phase shift circuit is further configured for a third control signal to control a switch in each of the first series switch capacitor circuit, the first series-parallel switch capacitor circuit, the second series-parallel switch capacitor circuit, and the series-parallel inductor circuit to adjust the capacitance and inductance of the phase shift circuit.

19. The method of claim 11, wherein the first switch is a first single pole double throw switch, and wherein the second switch is a second single pole double throw switch.

20. The method of claim 19, wherein the first single pole double throw switch comprises four transistors electrically connected in series; and wherein the second single pole double throw switch comprises four transistors electrically connected in series.

\* \* \* \* \*